United States Patent [19]

Banba et al.

[11] Patent Number: 5,449,584
[45] Date of Patent: Sep. 12, 1995

[54] POSITIVE PHOTO-SENSITIVE RESIN COMPOSITION COMPRISING A PHOTOSENSITIVE POLYBENZOXAZOLE OR A MIXTURE OF A POLYBENZOXAZOLE, AN ORGANIC SOLVENT SOLUBLE POLYMER AND A DIAZOQUINONE AND/OR A DIHYDROPYRIDINE COMPOUND

[75] Inventors: Toshio Banba; Etsu Takeuchi; Toshiro Takeda; Naoshige Takeda, all of Yokohama; Akira Tokoh, Tokyo, all of Japan

[73] Assignee: Sumitomo Bakelite Company, Ltd., Tokyo, Japan

[21] Appl. No.: 210,417

[22] Filed: Mar. 18, 1994

Related U.S. Application Data

[63] Continuation of Ser. No. 705,992, May 28, 1991, abandoned.

[30] Foreign Application Priority Data

| May 29, 1990 | [JP] | Japan | 2-137111 |
| May 29, 1990 | [JP] | Japan | 2-137112 |
| May 29, 1990 | [JP] | Japan | 2-137113 |
| Jun. 14, 1990 | [JP] | Japan | 2-154049 |
| Jul. 6, 1990 | [JP] | Japan | 2-177376 |
| Feb. 13, 1991 | [JP] | Japan | 3-104053 |

[51] Int. Cl.$^6$ ............................................. G03F 7/023
[52] U.S. Cl. .......................... 430/190; 430/165; 430/192; 430/193; 430/270; 430/906
[58] Field of Search ............... 430/192, 193, 165, 190, 430/270, 906

[56] References Cited

U.S. PATENT DOCUMENTS

| 4,339,521 | 7/1982 | Ahne et al. | 430/192 |
| 4,395,482 | 7/1983 | Ahne et al. | 430/192 |
| 4,619,500 | 10/1986 | Ahne et al. | 350/341 |
| 4,845,183 | 7/1989 | Mueller et al. | 528/185 |
| 4,849,051 | 7/1989 | Ahne et al. | 430/323 |
| 4,882,260 | 11/1989 | Kohara et al. | 430/192 |
| 4,906,549 | 3/1990 | Asaumi et al. | 430/192 |
| 4,939,215 | 7/1990 | Mueller et al. | 525/434 |
| 5,011,753 | 4/1991 | Mueller et al. | 430/192 |
| 5,021,320 | 6/1991 | Mueller et al. | 430/192 |
| 5,037,720 | 8/1991 | Khanna | 430/190 |
| 5,081,000 | 1/1992 | Kuehn et al. | 430/905 |
| 5,087,550 | 2/1992 | Blum et al. | 430/270 |
| 5,284,734 | 2/1994 | Blum et al. | 430/270 |

FOREIGN PATENT DOCUMENTS

| 0264678 | 4/1988 | European Pat. Off. |
| 0291779 | 11/1988 | European Pat. Off. |
| 0388482 | 9/1990 | European Pat. Off. |
| 0402141 | 12/1990 | European Pat. Off. |

OTHER PUBLICATIONS

Patent Abstracts of Japan vol. 8, No. 79 (P-267)(1516) 11 Apr. 1984 & JP-A-58 223 147 (Fuji Yakuhin Kogyo K.K.) 24 Dec. 1983 *abstract*.

*Primary Examiner*—Charles L. Bowers, Jr.
*Assistant Examiner*—John S. Chu
*Attorney, Agent, or Firm*—Browdy and Neimark

[57] ABSTRACT

The present invention provides a positive photo-sensitive resin composition comprising a polybenzoxazole precursor as a base resin, an organic solvent-soluble polymer or its precursor (e.g., a polyamic acid) as a component for imparting improved adhesion, flexibility or heat resistance, and a diazoquinone compound and/or a dihydropyridine compound as a photosensitive agent. This photo-sensitive resin composition can form a pattern of high resolution and further has excellent adhesion and mechanical properties. The present invention further provides three novel diazoquinone compounds as a photo-sensitive agent, which compounds give high resolution, high contrast and thick-film formability when compounded in a positive photo-sensitive resin composition. The present invention furthermore provides a new type positive photo-sensitive resin composition obtained by reacting a polybenzoxazole precursor with a diazoquinone compound as a photo-sensitive agent. This photo-sensitive resin composition has excellent alkali resistance when unexposed to a light and accordingly can give a high residual film ratio.

11 Claims, No Drawings

POSITIVE PHOTO-SENSITIVE RESIN COMPOSITION COMPRISING A PHOTOSENSITIVE POLYBENZOXAZOLE OR A MIXTURE OF A POLYBENZOXAZOLE, AN ORGANIC SOLVENT SOLUBLE POLYMER AND A DIAZOQUINONE AND/OR A DIHYDROPYRIDINE COMPOUND

This application is a continuation of application Ser. No. 07/705,992, filed May 28, 1991, now abandoned.

FIELD OF INVENTION

The present invention relates to a positive photo-sensitive resin composition having high sensitivity, resolution, adhesion, strength and thermal stability, as well as excellent processability and reliability.

BACKGROUND OF INVENTION

Semiconductors are making rapid progress in capacity, density, integration and surface mounting. Along with this progress, a number of problems are arising in production of semiconductor devices. One of the problems is that the heat or thermal stress applied to a semiconductor chip at the time of surface mounting becomes more severe as the sealing material becomes thinner or depending upon the method of surface mounting. Hence, it is necessary to protect the fine semiconductor circuits from said heat or thermal stress. Meanwhile, in order to form circuits of high density and integration on a semiconductor chip, the technique of multi-layer wiring is indispensable. To achieve it, there is required an interlayer dielectric having high heat resistance, high adhesion and low dielectric constant.

It is known that the above problems can be solved by using a highly heat-resistant polymer such as polyimide or the like, having excellent heat resistance and mechanical properties, as a passivation film, a buffer coat film or an interlayer dielectric. As such a highly heat-resistant polymer for use in semiconductor production, photo-sensitive polyimides have drawn attention in recent years (e.g., Japanese Patent Publication No. 30207/1980 and Japanese Patent Application Laid-Open No. 145794/1979). These polyimide resins have photo-sensitivity by themselves and can give viaholes for wiring, without using any resist. Therefore, in making viaholes, steps of resist coating and its peeling are not required. Further, no harmful chemicals such as hydrazine, halogen-containing solvent and the like are used in its processing, and an ordinary organic solvent is used, which allows safe operation and gives no environmental pollution.

As a noteworthy novel photo-sensitive resin, there can be mentioned positive photo-sensitive polybenzoxazoles constituted by a polybenzoxazole and a diazoquinone compound (e.g., Japanese Patent Publication No. 46862/1989). These resins have high heat resistance, good processability, excellent electrical properties (e.g., low dielectric constant), fine pattern formability and high sensitivity and has a possibility of being used for wafer coating or formation of interlayer dielectric. Further, these positive photo-sensitive resins use an aqueous alkaline solution in forming viaholes, and accordingly require no organic solvent unlike conventional photo-sensitive polyimides, and thus allow operation of higher safety.

Conventional photo-sensitive polybenzoxazoles, however, have a serious drawback in that they have poor adhesion to a substrate, particularly silicon wafer and are peeled from the substrate during development or because of moisture absorption after curing. Further, the film formed after heating and ring closure has slightly insufficient strength and is fragile. As a measure to overcome these drawbacks, it is considered to introduce an adhesion-improving component, a flexibility-improving component, etc. into the main chain of the polymer. However, a polybenzoxazole precursor is actually synthesized by reaction between a dihydroxydiamine and a dicarboxylic acid dichloride; this reaction is effected under narrow reaction conditions; and copolymerization of different components of different reactivities is very difficult to control.

Properties which a photo-sensitive resin composition used for semiconductors must have, include high resolution, high contrast, thick-film formability, etc. Among these properties, high contrast and thick-film formability are greatly dependent upon, in particular, the molecular structure of a photo-sensitive diazoquinone compound. That is, it is required that the diazoquinone compound be soluble in the polymer or its precursor, that the diazoquinone compound can effectively reduce the solubility of the coated film in alkali solution before light exposure, but after light exposure, can heighten the solubility of the polymer or its precursor in alkali solution, and that the photo-sensitive diazoquinone compound after reaction has such a high transparency that the applied light can well reach as far as the bottom of the thick film.

As the photo-sensitive diazoquinone compound, there are generally used esters between 1,2-naphthoquinonediazide-5-sulfonic acid and a phenol, and there are known, for example, polyfunctional photosensitive diazoquinone compounds represented by the following structural formulas [XVI] and [XVII] using a polyfunctional phenol.

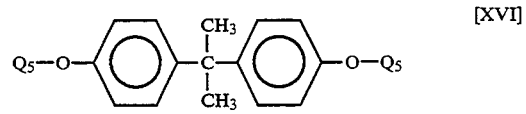

[XVI]

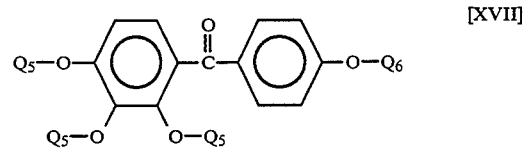

[XVII]

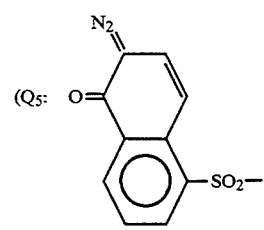

,

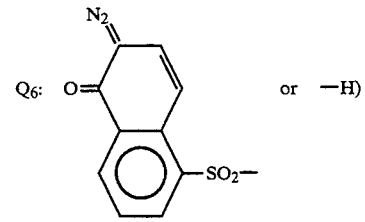

or —H)

In these photo-sensitive diazoquinone compounds, however, ultraviolet absorption by the aromatic ring of phenoxy group is not negligibly small, which hindered arrival of light to the bottom of thick film and gave a limit to thick-film formability. Further, when a photo-sensitive resin is used as an interlayer dielectric for multi-layer wiring in semiconductor circuits or as a coating material for semiconductor chips, the photo-sensitive resin is required to have low dielectric constant and low water absorption in view of high-speed operation and reliability. In conventional positive photo-sensitive resins, however, the cured film produced therefrom was insufficient in the above properties because of the polar phenol remaining in the film.

Thus, the conventional positive polybenzoxazoles have excellent properties but simultaneously various serious drawbacks, and as a result find very limited applications.

SUMMARY OF INVENTION

It is an object of the present invention to provide a novel positive photo-sensitive resin composition using a polybenzoxazole as a base resin, which has excellent adhesion and mechanical properties without impairing the excellent processability and heat resistance possessed by the positive photo-sensitive polybenzoxazole, and furthermore to provide novel diazoquinone compounds which can allow said positive photo-sensitive resin composition to exhibit high resolution, high contrast and thick-film formability.

DETAILED DESCRIPTION OF EMBODIMENTS

The present invention provides a positive photosensitive resin composition comprising:

(i) 100 parts by weight of a polybenzoxazole precursor (D) having a polymerization degree of 2–500, obtained by polymerizing monomers (A), (B) and (C) having groups represented by the following formulas [I], [II] and [III], respectively,

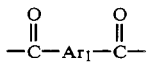
[I]

wherein $Ar_1$ is a divalent aromatic or heterocyclic group,

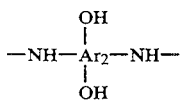
[II]

wherein $Ar_2$ is a tetravalent aromatic or heterocyclic group,

 [III]

wherein $Ar_3$ is a divalent aromatic, heterocyclic, alicyclic, silicon-containing or aliphatic group, in such proportions as to satisfy the following formula, (A)/[(B)+(C)]:0.9–1.1 wherein (B) is 2–100 mole % and (C) is 0–98 mole % with the total of (B) and (C) being 100 mole %, (ii) 1–200 parts by weight of at least one organic solvent-soluble polymer having an aromatic group and/or a heterocyclic group or its precursor (E), the polymer being selected from polyimide, polybenzoimidazole, polybenzothiazole, polytriazole, polyoxadiazole, polythiadiazole, polybenzoxazinone, polyquinazolinedione, polyimidoisoindoloquinazolinedione, polyquinazolone, polyquinacridone, polyanthrazoline, polyindophenazine and polyhydantoin, and (iii) 10–100 parts by weight of a photo-sensitive agent (H) consisting of a diazoquinone compound (F) and/or a dihydropyridine compound (G).

Furthermore, the present invention provides a photosensitive diazoquinone compound having the structure represented by the following formula [VI]

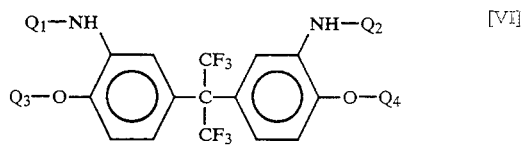

wherein $Q_1$ to $Q_4$ are each hydrogen atom or 1,2-naphthoquinonediazide-5-sulfonyl group and at least one of $Q_1$ to $Q_4$ is 1,2-naphthoquinonediazide-5-sulfonyl group, a photosensitive diazoquinone compound having the structure represented by the following formula [VII]

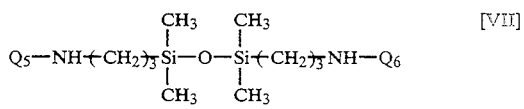

wherein $Q_5$ and $Q_6$ are each hydrogen atom or 1,2-naphthoquinonediazide-5-sulfonyl group and at least one of $Q_5$ and $Q_6$ is 1,2-naphthoquinonediazide-5-sulfonyl group, and a photo-sensitive diazoquinone compound having the structure represented by the following formula [VIII]

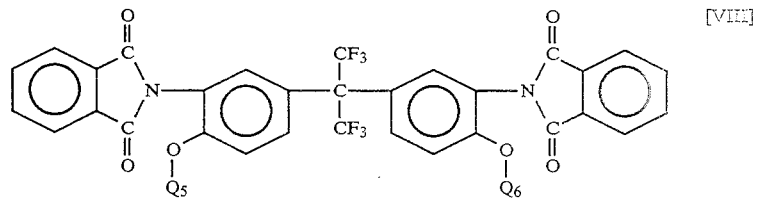

wherein $Q_5$ and $Q_6$ each have the same definition as given above.

Moreover, the present invention provides a positive photo-sensitive resin composition comprising a photosensitive group-containing polybenzoxazole precursor (T) having a polymerization degree of 2–500, obtained by polymerizing monomers (A), (S) and (C) having groups represented by the following formulas [I], [XV] and [III], respectively, $$-\overset{O}{\overset{\|}{C}}-Ar_1-\overset{O}{\overset{\|}{C}}- \qquad [I]$$

wherein $Ar_1$ is a divalent aromatic or heterocyclic group, $$-NH-\underset{(OQ)l_2}{\overset{(OH)l_1}{Ar_4}}-NH- \qquad [XV]$$

wherein $Ar_4$ is a tetravalent aromatic or heterocyclic group, $l_1$ is an integer of 0–2, $l_2$ is an integer of 1–2, the sum of $l_1$ and $l_2$ is 2, and Q is

[structures with N_2, SO_2 groups shown] or

[additional naphthalene-N_2-SO_2 structure]

$$-NH-Ar_3-NH- \qquad [III]$$

wherein $Ar_3$ is a divalent aromatic, heterocyclic, alicyclic, silicon-containing or aliphatic group, in such proportions as to satisfy the following formula, $$(A)/[(S)+(C)] = 0.9-1.1$$

wherein (S) is 2–100 mole % and (C) is 0–98 mole % with the total of (S) and (C) being 100 mole %.

In the monomer (A) which is a constituent of the polybenzoxazole precursor (D) of the present invention, $Ar_1$ is a divalent aromatic or heterocyclic group and includes, for example,

[aromatic structures shown, including pyridine and biphenyl]

[additional biphenyl and diaryl-X_1 structures] and wherein $X_1$ is $-CH_2-$, $-O-$, $-S-$, $-SO_2-$, $-CO-$, $-NHCO-$ or $-C(CF_3)_2-$. However, $Ar_1$ is not restricted to these groups.

In the monomer (B) which is a constituent of the precursor (D), $Ar_2$ is a tetravalent aromatic or heterocyclic group and includes, for example,

[tetravalent aromatic and naphthalene structures]

[diaryl-X_2 structures] and

[furan and pyrrole structures]

wherein $X_2$ is $-CH_2-$, $-O-$, $-S-$, $-SO_2-$, $-CO-$, $-NHCO-$ or $-C(CF_3)_2-$. However, $Ar_2$ is not restricted to these groups.

The monomer (A) having $Ar_1$ and the monomer (B) having $Ar_2$ may be each a mixture of two or more monomers.

In the monomer (C) which is a constituent of the precursor (D), Ar$_3$ is a divalent aromatic, heterocyclic, alicyclic, silicon-containing or aliphatic group. The Ar$_3$-containing monomer (C) includes, for example, m-phenylenediamine, p-phenylenediamine, 2,3,5,6-tetramethyl-p-phenylenediamine, 1-isopropyl-2,4-phenylenediamine, bis(trifluoromethyl)phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 5-methylnonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminododecane, 1,12-diaminooctadecane, 2,12-diaminooctadecane, 2,17-diaminoeicosane, 3,3'-diaminodiphenylmethane, 4,4-diaminodiphenylmethane, 3,3-dimethyl-4,4'-diaminodiphenylmethane, bis(p-aminocyclohexyl)methane, 3,3'-diaminodiphenylethane, 4,4'-diaminodiphenylethane, 4,4'-diaminodiphenyl ether, bis(p-$\beta$-amino-t-butylphenyl) ether, 3,3'-dimethyl-4,4'-diaminodiphenyl ether, 3,3'-diaminodiphenylpropane, 4,4'-diaminodiphenylpropane, 2,2'-bis(p-aminophenyl) propane, 2,2'-bis(aminophenyl)hexafluoropropane, 2,2'-bis[4-(p-aminophenoxy)phenyl]propane, 2,2'-bis[(aminophenoxy)phenyl]hexafluoropropane, bis{[(trifluoromethyl)aminophenoxy]phenyl}hexafluoropropane, 2,5-diamino-m-xylene, 2,5-diamino-p-xylene, 2,6-diaminopyridine, 2,5-diaminopyridine, 2,6-diamino-4-trifluoromethylpyridine, 2,5-diamino-1,3,4-oxadiazole, 1,4-diaminocyclohexane, piperazine, 4,4'-methylenedianiline, 4,4'-methylene-bis(o-chloroaniline), 4,4'-methylene-bis(3-methylaniline), 4,4'-methylene-bis(2-ethylaniline), 4,4'-methylene-bis(2-methoxyaniline), 4,4'-methylene-bis(2-methylaniline), 4,4'-oxy-dianiline, 4,4'-oxy-bis(2-methoxyaniline), 4,4'-oxy-bis(2-chloroaniline), 4,4'-thio-dianiline, 4,4'-thio-bis(2-methylaniline), 4,4'-thio-bis(2-methoxyaniline), 4,4'-thio-bis(2-chloroaniline), 3,3'-sulfonyl-dianiline, 4,4'-sulfonyldianiline, 4,4'-sulfonyl-bis(2-methylaniline), 4,4'-sulfonyl-bis(2-ethoxyaniline), 4,4'-sulfonyl-bis(2-chloroaniline), 4,4'-isopropylidene-dianiline, 4,4'-methylene-bis(3-carboxyaniline), 1,3-bis(3-aminopropyl)tetramethyldisiloxane, 1,3-bis(2-aminoethylaminomethyl)-1,1',3,3'-tetramethyldisiloxane, 1,3-bis(m-aminophenyl)-1,1',3,3'-tetramethyldisiloxane, bis(aminopropyl)polydimethylsiloxane, bis(aminophenyl)polydimethylsiloxane, 1,4-bis(3-aminopropyldimethylsilyl)benzene, bis(4-aminophenyl)dimethylsilane, bis(4-aminophenyl)diethylsilane, bis(4-aminophenyl)diphenylsilane, bis(4-aminophenoxy)dimethylsilane, 5,5-methylene-bis(2-aminophenol) 5,5-oxy-bis (2-aminophenol), 5,5-sulfonyl-bis (2-aminophenol), bis (4-aminophenyl)ethylphosphine oxide, N-[bis (4-aminophenyl)]-N-methylamine, N-[bis(4-aminophenyl)]-N-phenylamine, 5-amino-1-(4-aminophenyl)-1,3,3-trimethylindane, 3,3'-diamino-diphenyl sulfide, 4,4'-diamino-diphenyl sulfide, 3,3'-diamino-diphenylsulfone, 4,4'-diaminodiphenylsulfone, 3,3'-diamino-diphenyl ether, 4,4'-diamino-diphenyl ether, 2,2'-bis(trifluoromethyl)-4,4'-diamino-diphenyl ether, 3,3'-bis(trifluoromethyl)-4,4'-diamino-diphenyl ether, 3,3',5,5'-tetrakis(trifluoromethyl)-4,4'-diamino-diphenyl ether, diaminobenzene trifluoride, 2,6-diamino-4-carboxylic benzene, bis{2-[(aminophenoxy)phenyl]hexafluoroisopropyl}benzene, 1,4-bis(p-aminophenoxy)benzene, bis(aminophenoxy)-di-(trifluoromethyl)benzene, bis(aminophenoxy)tetrakis(trifluoromethyl)benzene, bis[(trifluoromethyl)aminophenoxy]benzene, bis(p-$\beta$-methyl-$\delta$-aminopentyl)benzene, p-bis (2-methyl-4-aminopentyl) benzene, p-bis (1,1-dimethyl-5-aminopentyl) benzene, diaminotetra (trifluoromethyl) benzene, diamino (pentafluoroethyl) benzene, benzidine, 3,3'-dimethylbenzidine, 3,3'-dimethoxybenzidine, 2,2'-bis (trifluoromethyl) benzidine, 3,3'-bis(trifluoromethyl)benzidine, 3,3'-dichlorobenzidine, 3,3'-dicarboxybenzidine, 3,3'-diamino-4,4'-dicarboxylic benzidine, 3,3'-diaminodiphenyl, 3,4'-diamino-diphenyl, 4,4'-diamino-biphenyl, 3,3'-dimethyl-4,4'-diaminodiphenyl, 4,4'-bis(p-aminophenoxy)biphenyl, bis[(trifluoromethyl)aminophenoxy]biphenyl, 3,3'-diaminobenzophenone, 3,4'-diaminobenzophenone, 4,4'-diaminobenzophenone, 3,3'-bis(trifluoromethyl)-4,4'-diamino-benzophenone, 3,3'-dimethyl-4,4'-diaminobenzophenone, 3,3'-dimethoxy-4,4'-diaminobenzophenone, 3,3'-dichloro-4,4'-diaminobenzophenone, 3,3''-diamino-p-terphenyl, 4,4''-diamino-p-terphenyl, 4,4'''-diaminoquaterphenyl, 1,5-diaminonaphthalene, 2,6-diaminonaphthalene, 2,4-diaminotoluene, 2,5-diaminotoluene and 2,4-bis($\beta$-amino-t-butyl)toluene. These compounds may be used in combination of two or more. The monomer (C) is not restricted to these compounds.

The polybenzoxazole precursor (D) of the present invention can be produced by, for example, condensing a dihydroxydiamine having Ar$_2$ group with a dichloride of dicarboxylic acid having Ar$_1$ group, or condensing a dihydroxydiamine having Ar$_2$ group with a dicarboxylic acid having Ar$_1$ group in the presence of a dehydration and condensation agent such as dicyclohexylcarbodiimide or the like. In order to obtain a resin having a high photo-patterning ability (high transparency and high solubility in alkali) and high adhesion to a substrate, it is desirable to effect the above condensation using, as the dihydroxydiamine, 2,2-bis(3-amino-4-hydroxyphenyl)hexafluoropropane, 3,3'-dihydroxy-4,4'-diaminodiphenylether, or 3,3-dihydroxybenzidine and, as the dicarboxylic acid, isophthalic acid, terephthalic acid, 4,4'-diphenylether dicarboxylic acid, a dichloride of disiloxane-containing dicarboxylic acid or a mixture thereof, to obtain a precursor (D).

One of the features of the present invention is that the present photo-sensitive resin composition comprises, together with the polybenzoxazole precursor, a highly heat-resistant polymer or its precursor as an essential component. By selecting, as the heat-resistant polymer, a polymer having excellent adhesion to a substrate or excellent flexibility, the present photo-sensitive resin composition is improved not only in heat resistance but also in film fragility and adhesion to a substrate which were drawbacks of the conventional polybenzoxazoles, without impairing excellent fine processability and electrical properties possessed by the conventional polybenzoxazoles. As the heat-resistant polymer, there can be mentioned polyimide, polybenzoimidazole, polyimidazopyrrolone, polybenzothiazole, polytriazole, polyoxadiazole, polythiadiazole, polybenzoxazinone, polyquinazolinedione, polyimidoisoindoloquinazolinedione, polyquinazolone, polyquinacridone, polyanthrazoline, polyindophenazine and polyhydantoin; and as the precursor of the heat-resistant polymer, there can be mentioned polyamic acid, polyamidoamine, polyamidothiol, polyhydrazine, polyhydrazide, polythiohydrazide, polyuric acid, polyamic acid monoamide, etc. These polymers and precursors (E) are required to have an aromatic group and/or a heterocyclic group in order to exhibit high heat resistance. A polyamic acid having a structure represented by the following formula [XVIII] is particularly desirable to obtain high flexibility and heat resistance:

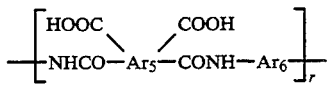   [XVIII]

wherein r is a natural number of 1-500; Ar$_5$ is

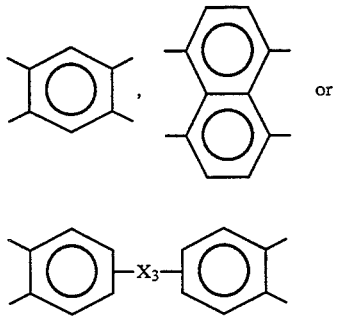

and Ar$_6$ is

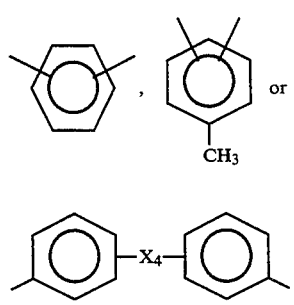

(X$_3$ and X$_4$ are each a direct bond, —O—,

—S—,

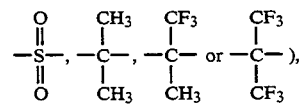

with the Ar$_5$ being preferably

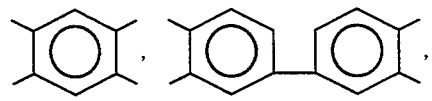

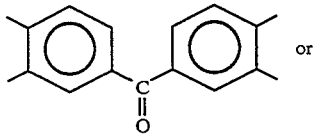

and the Ar$_6$ being preferably

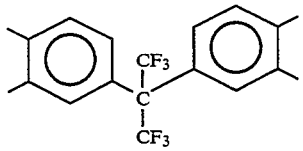

Allowing the above heat-resistant polymer to further contain a siloxane unit represented by the following formula [IV] gives a photo-sensitive resin composition of remarkably improved adhesion to a substrate.

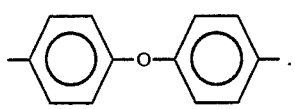   [IV]

In the above formula, R$_1$ to R$_2$ are each a divalent aliphatic or aromatic group, R$_3$ to R$_6$ are each a monovalent unsubstituted or substituted aliphatic or aromatic group, desirably methyl group for effective improvement of adhesion to a substrate, and k is a natural number of 1-100, preferably 1-5, particularly preferably 1.

The amount of the heat-resistant polymer in the resin composition is 1-200 parts by weight per 100 parts by weight of the polybenzoxazole precursor. When the amount is less than 1 part by weight, the polymer shows no improvement in heat resistance, flexibility and adhesion. When the amount is more than 200 parts by weight, the resulting resin composition has reduced pattern formability and storage stability.

The diazoquinone compound (F) used as a photosensitive agent (H) in the present invention is a compound having an o-benzoquinonediazide or o-naphthoquinonediazide structure. Its photo-sensitivity is publicly known in U.S. Pat. Nos. 2,772,972, 2,797,213, 3,669,658, etc. The diazoquinone compound per se is difficultly soluble in an aqueous alkali solution but, when exposed to a light, the compound produces a carboxyl group and becomes readily soluble in the aqueous alkali solution. Owing to this property, when the diazoquinone compound is incorporated into an alkali-soluble polymer, the resulting mixture has different solubilities in an aqueous alkali solution between the exposed portions and the unexposed portions; thereby, photo-patterning becomes possible. In the present invention, a polybenzoxazole precursor is used as the alkali-soluble polymer. The diazoquinone compound is required to have various properties as follows. That is, the compound is required (a) to have excellent photosensitivity and, when added to an alkali-soluble polymer, (b) to greatly reduce the solubility of the polymer in an aqueous alkali solution and, after light exposure, significantly increase said solubility, (c) not to impair the adhesion of the polymer to a substrate and desirably to increase the adhesion, (d) to suppress the coloring of the polymer as well as reduction in sensitivity due to light absorption, and (e) not to impair the heat resistance of the polymer and desirably to increase said heat resistance. As the diazoquinone compound satisfying such requirements, there can be mentioned compounds represented by the following formulas [VII to [IX]:

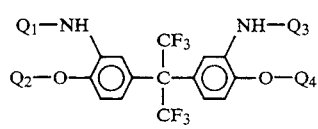

[VI]

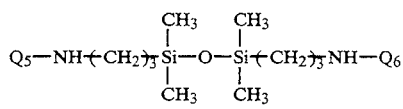

[VII]

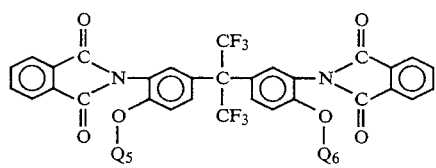

[VIII]

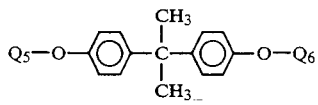

[IX]

wherein $Q_1$ to $Q_6$ are each hydrogen atom or 1,2-naphtho-quinonediazide-5-sulfonyl group, and at least one of $Q_1$ to $Q_4$ and at least one of $Q_5$ to $Q_6$ are each 1,2-naphtho-quinonediazide-5-sulfonyl group. The amount of the diazoquinone compound used in the present photosensitive resin composition is 10–100 parts by weight, preferably 5–50 parts by weight per 100 parts by weight of the polybenzoxazole precursor. When the amount is less than 10 parts by weight, the resulting resin composition has poor photo-patterning ability. When the amount is more than 100 parts by weight, the resin composition gives a film of significantly low strength.

The dihydropyridine compound (G) used as a photosensitive agent (H) in the present invention is a compound represented by any one of the following formulas [X] or [XIV].

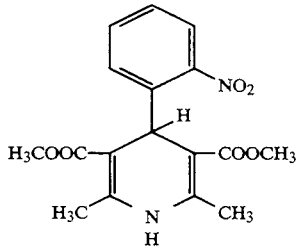

[X]

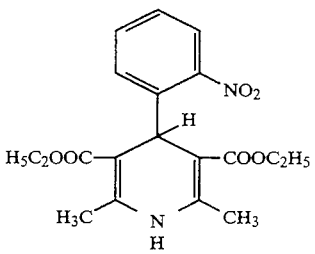

[XI]

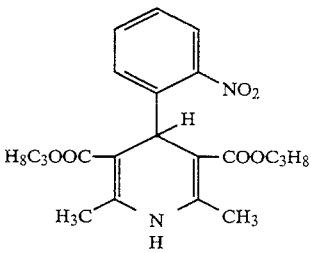

[XII]

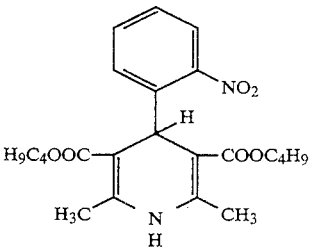

[XIII]

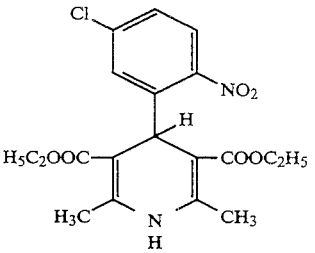

[XIV]

The dihydropyridine compounds represented by the formulas X] to [XIV] are known substances shown in Journal of Imaging Science, 34, 50–54 (1990). The Journal describes that a combination of the dihydropyridine compound with a novolac resin enables photo-patterning and gives a good pattern similarly to an ordinary novolac resist using a diazoquinone. As to the photoreaction, Berson et al. describe in J. Am. Chem. Soc. 77, 447 (1955) that 2,6-dimethyl-3,5-diacetyl-4-(2'-nitrophenyl)-1,4-dihydropyridine, for example, is converted to 2,6-dimethyl-3,5-diacetyl-4-(2'-nitrophenyl)pyridine of higher hydrophilicity and resultantly becomes readily soluble in an aqueous alkali solution. A combination of a polybenzoxazole precursor with a dihydropyridine compound having the above property, can give good patterning at least equal to the case of the above-mentioned novolac resin. The novolac resin gives the same result between when combined with a naphthoquinonediazide compound and when combined with a dihydropyridine compound; meanwhile, a positive photo-sensitive resin composition comprising a polybenzoxazole precursor as a base and a dihydropyridine compound gives a cured film of excellent mechanical properties. This is because the dihydropyridine compound is completely vaporized at the time of curing.

In the present resin composition, it is possible to use, as a photo-sensitive agent, a combination of a diazoquinone compound and a dihydropyridine compound. The combination use gives a high residual film ratio at the time of development and also gives a film excellent in mechanical properties after curing.

The amount of the dihydropyridine compound used in the present resin composition is 10-100 parts by weight, preferably 15-50 parts by weight per 100 parts by weight of the polybenzoxazole precursor. When the amount is less than 10 parts by weight, the resulting resin composition gives poor photo-patterning. When the amount is more than 100 parts by weight, the resin composition causes reprecipitation, making the storability poor.

In the present invention, it is possible to allow a diazoquinone compound to react with a part of monomers for the polybenzoxazole precursor, at the time of producing the precursor. For example, a quinonediazide-containing group of the formula [XV] having, as Q, a structure represented by the following formula,

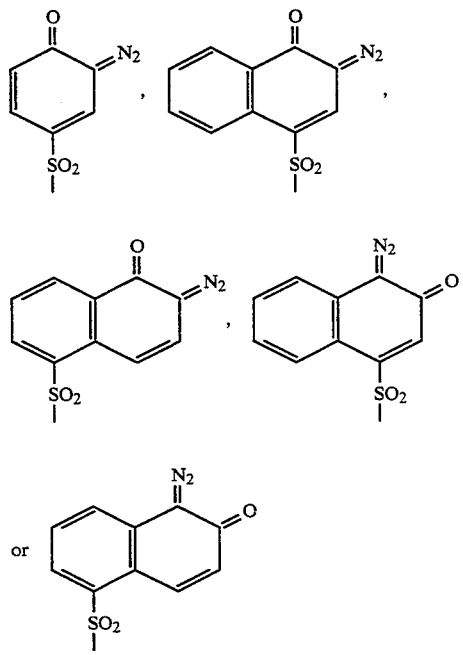

can be introduced into the main chain of the polybenzoxazole precursor.

It is also possible to react a polybenzoxazole precursor with a diazoquinone compound, as a new technique in the present invention. Q shown in the group represented by the formula [XV] is

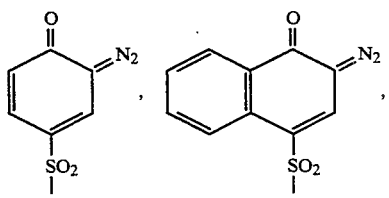

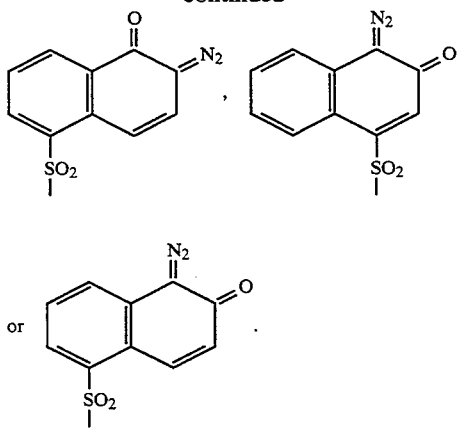

The diazoquinone compound having said group is preferably an o-quinonediazide compound such as 1,2-benzoquinone-diazide-4-sulfonic acid, 1,2-naphthoquinonediazide-4-sulfonic acid, 1,2-naphthoquinonediazide-5-sulfonic acid, 2,1-naphthoquinonediazide-4-sulfonic acid, 2,1-naphthoquinonediazide-5-sulfonic acid or the like, but is not restricted to them.

In the present invention, the polybenzoxazole precursor containing a photo-sensitive group Q can be obtained by subjecting to polycondensation an $Ar_2$ group-containing compound (e.g., aromatic diaminodihydroxy compound), an $Ar_3$ group-containing compound (e.g., diaminosiloxane), and an $Ar_1$ group-containing compound (e.g., aromatic dicarboxylic acid chloride or aromatic dicarboxylic acid or aromatic dicarboxylic acid ester) to prepare a polycondensate, dissolving a Q group-containing compound (e.g., sulfonyl chloride of o-quinonediazide) in a solvent (e.g., tetrahydrofuran, diglyme, dimethylsulfoxide, N-methylpyrrolidone, N,N-dimethylacetamide, or dimethylformamide), adding to the resulting solution a base (e.g., triethylamine, or pyridine) as an acid-removing agent, and reacting the above polycondensate with the Q group-containing compound present in the solution. The degree of reaction of the o-quinonediazide toward the polybenzoxazole precursor is preferably 2-50%, particularly preferably 10-20% relative to hydroxyl groups. When the reaction degree is less than 2%, the resulting product is usable but has too high solubility in an aqueous alkali solution, which tends to cause dissolution of unexposed portions, i.e., severe thinning of film. When the reaction degree is more than 50%, the resulting product is also usable, but has increased hydrophobicity and tends to be insoluble in an aqueous alkali solution.

In the present invention, excellent adhesion can be obtained by, at the time of synthesis of the polybenzoxazole precursor, adding 2-20 mole %, preferably 5-10 mole % of a diaminosiloxane compound represented by the following formula [XIX]

[XIX]

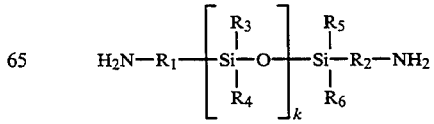

wherein $R_1$ to $R_2$ are each a divalent aliphatic or aromatic group, $R_3$ to $R_6$ are each a monovalent aliphatic or aromatic group, and k is 1–100, to effect the reaction. When the amount of the diaminosiloxane compound added is less than 2 mole %, the resulting product is usable but tends to have reduced adhesion to silicon oxide film. When the amount is more than 20 mole %, the resulting product is also usable but tends to give a fragile film after curing.

In the present invention, there are particularly advantageously used alkali-soluble heat-resistant polymers or precursors thereof, having an aromatic group and/or a heterocyclic group and also a phenolic hydroxyl group, a phenolic SH group or a carboxyl group, such as polybenzoxazole, polyimide, polybenzothiazole, polybenzoxazinone, polyquinazolinedione and polyimidoisoindoloquinazolinedione.

The positive photo-sensitive resin composition of the present invention may further comprise additives such as levelling agent, adhesion improver and the like.

The positive photo-sensitive resin composition of the present invention can be used in a solution dissolved in a solvent. The solvent includes N-methylpyrrolidone, N,N-dimethylacetamide, etc.

In applying the positive photo-sensitive resin composition of the present invention, firstly the composition is coated on an appropriate substrate such as silicon wafer, ceramic substrate or the like. The coating is effected by spin coating using a spinner, spray coating using a spray coater, immersion, printing, roll coating, etc. Then, the resulting film is prebaked at a low temperature of 60°–100° C. to dry the film. Thereafter, actinic rays are applied to the dried film in a desired pattern shape. As the actinic rays, there can be used X-rays, electron beam, ultraviolet rays, visible light, etc. Rays having a wavelength of 200–500 nm are preferred.

Next, the film is subjected to development to dissolve and remove the exposed portions, whereby a relief pattern is obtained. As the developer, there can be preferably used aqueous solutions of alkalis such as inorganic alkali (e.g., sodium hydroxide, potassium hydroxide, sodium carbonate, sodium silicate, sodium metasilicate, ammonia water), primary amine (e.g., ethylamine, n-propylamine), secondary amine (e.g., diethylamine, di-n-propylamine), tertiary amine (e.g., triethylamine, methyldiethylamine), alcoholamine (e.g., dimethylethanolamine, triethanolamine) and quaternary ammonium salt (e.g., tetramethylammonium hydroxide, tetraethylammonium hydroxide), and aqueous solutions obtained by adding to the above aqueous alkali solution an appropriate amount of a salt (e.g., calcium compound, strontium compound, or barium compound), a water-soluble organic solvent (e.g., alcohol such as methanol or ethanol) or a surfactant.

One aspect of the present invention resides in using, as a developer, an aqueous alkali solution containing calcium compound, strontium compound or barium compound. The use of such a developer has made it possible to allow the resin pattern formed after development to have very high contrast. The contrast-enhancing effect by the above metal compound is brought about because the metal compound-insolubilizes particularly unexposed portions of the resin film to a high degree. The detailed mechanism is not made clear, but the very high contrast is presumed to appear as a result of some interaction between the metal cation and the resin of the unexposed portions. Examples of the metal compound include basic compounds such as calcium oxide, calcium hydroxide, strontium oxide, strontium hydroxide, barium oxide, barium hydroxide and the like, and inorganic or organic salts such as calcium chloride, calcium nitrate, calcium acetate, strontium chloride, strontium nitrate, strontium acetate, barium chloride, barium nitrate and barium acetate. The metal compound is not restricted to these compounds.

In the present invention, the amount of the metal compound used in a developer depends on the type of the metal used, but is 1–1,000 ppm, desirably 10–200 ppm of the total developer, in terms of metal amount. When the amount is less than 1 ppm, no contrast enhancement is obtained because the amount is too small. When the amount is more than 1,000 ppm, not only the unexposed portions but also the exposed portions have significantly reduced solubility, making it impossible to obtain a good pattern.

Development can be effected by means of spray, puddling, immersion, ultrasonic wave or the like.

The relief pattern obtained by development is then rinsed. Distilled water is used for rinsing. Thereafter, heat treatment is effected to form oxazole rings to obtain a final pattern of high heat resistance.

The photo-sensitive resin composition of the present invention is useful not only in semiconductor applications but also as interlayer dielectric of multilayer circuit, cover coat of flexible copper-clad plate, solder resist film, liquid crystal oriented film, etc.

Also, the photo-sensitive resin composition of the present invention is used for electronic materials such as semiconductor devices mentioned below, by making into a composite material with an inorganic material, etc.

(i) A semiconductor device made by coating the photo-sensitive resin composition of the present invention on the surface of a semiconductor element (e.g., IC or LSI), and subjecting the coated composition to light exposure, development and curing to form a pattern, which is used as passivation film, buffer film or protective film for α rays.

(ii) A semiconductor device having multilayer wirings, which is made by repeating procedures which comprise coating the photo-sensitive resin composition of the present invention on the surface of a semiconductor element (e.g., IC or LSI), subjecting the coated composition to light exposure, development and curing to form a pattern, wiring a conductor circuit, and connecting the circuit with the lower conductor layer, wherein the present composition is used as an interlayer dielectric.

(iii) A semiconductor device which is made by repeating procedures which comprise forming a pattern on a substrate (e.g., silicon or alumina) using the photo-sensitive resin composition of the present invention to produce an insulation layer, then wiring a conductor circuit, and connecting the circuit with the lower conductor layer, and by connecting the resultant product with a semiconductor element.

The present invention is hereinafter illustrated specifically by way of Examples.

EXAMPLE 1

Synthesis of polybenzoxazole precursor (D)

Into a four-necked separable flask provided with thermometer, stirrer, inlet for starting materials and inlet for dry nitrogen gas was fed a solution of 36.63 g (0.100 mol) of hexafluoro-2,2-bis(3-amino-4-hydroxyphenyl)propane dissolved in 130 ml of dimethylactamide and 16.61 g (0.210 mol) of pyridine. Thereto was dropwise added 21.32 g (0.105 mol) of an equimolar mixture of isophthalic acid chloride and terephthalic acid chloride dissolved in 40 ml of cyclohexane, at −10° C. to −15° C. in 30 minutes. The resulting mixture was stirred at room temperature for 4 hours to complete the reaction. The reaction mixture was filtered, and the filtrate was poured in water to precipitate a polymer [a polybenzoxazole precursor (D)]. The polybenzoxazole precursor (D) was collected by filtration, washed with water thoroughly, and vacuum-dried at 80° C. for 24 hours to obtain a polybenzoxazole precursor (D) represented by the following structural formula [XX]:

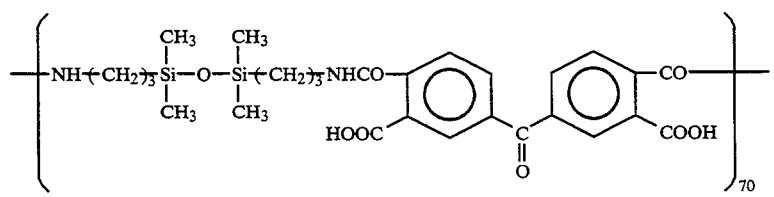

wherein m is 210.

Synthesis of polyamic acid (E)

In 400 g of N-methyl-2-pyrrolidone were dissolved 43.55 g (17.52 mol) of 1,3-bis(γ-aminopropyl)-1,1,3,3-tetramethylsiloxane and 56.45 g (17.52 mol) of benzophenonetetracarboxylic acid dianhydride. The resulting solution was stirred at room temperature for 5 hours. The reaction mixture was poured in water to form a precipitate. The precipitate was vacuum-dried at 80° C. to obtain a polyamic acid (E) represented by the following formula [XXI].

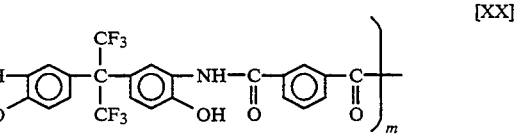

Synthesis of diazoquinone compound (F)

24.06 g (0.0895 mol) of naphthoquinone-1,2-diazide-5-sulfonic acid chloride and 10.94 g (0.0299 mol) of hexafluoro-2,2-bis(3-amino-4-hydroxyphenyl)propane were dissolved in 150 ml of tetrahydrofuran in the presence of 9.06 g (0.0895 mol) of triethylamine. The resulting solution was stirred at room temperature for 5 hours. After completion of the reaction, the reaction mixture was filtered to remove triethylamine hydrochloride, and the filtrate was poured in water to form a precipitate. The precipitate was washed with water thoroughly and vacuum-dried at 50° C. to obtain a diazoquinone compound (F) represented by the following structural formula [XXII].

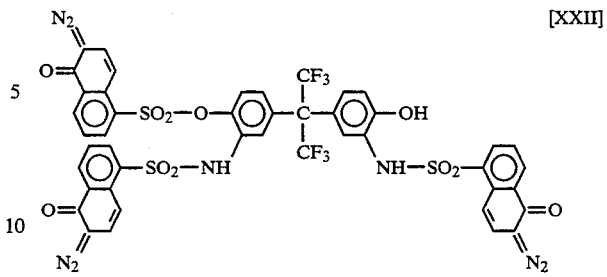

Preparation of photo-sensitive resin composition

100 Parts by weight of the polybenzoxazole precursor [XX], 20 parts by weight of the polyamic acid [XXI] and 20 parts by weight of the diazoquinone compound XXII], all obtained above, were dissolved in 200 parts by weight of N-methylpyrrolidone to obtain a photosensitive resin composition.

Evaluation of patterning

The above composition was coated on a silicon wafer using a spinner and dried in a dryer at 80° C for 1 hour to obtain a film of about 6 μm in thickness. On this film was superimposed a mask for measurement of resolution (Toppan Test Chart No. 1 manufactured by TOPPAN PRINTING CO., LTD.). The film was irradiated with ultraviolet rays of 100 mJ/cm² through the mask, then subjected to development with a 1.06% aqueous tetramethylammonium hydroxide solution, and rinsed with distilled water thoroughly, whereby a good pattern having a high resolution (up to 3.0 μm) was obtained. The used composition showed no pattern peeling during development and had high adhesion.

Separately, the same composition was coated on an aluminum plate of 6 cm×6 cm using a spinner and then heated to 350° C. in 3 hours in a dryer. Thereafter, the aluminum plate was removed by etching to obtain a film of about 30 μm in thickness. The film was measured for dielectric constant in accordance with JIS C 6481. The dielectric constant was 2.9 (room temperature, 1 MHz) and was excellent.

Further, the composition was applied to a semiconductor device, which gave excellent effects.

EXAMPLE 2

The procedures of Example 1 were repeated except that the diazoquinone compound [XXII] was replaced by 15 parts by weight of a diazoquinone compound represented by the following structural formula [XXIII].

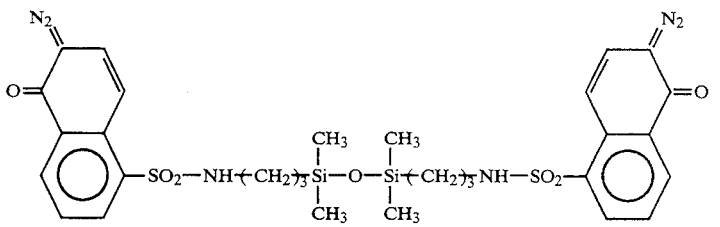

[XXIII]

As a result, a good pattern of high resolution (up to 2.0 μm) was formed. No pattern peeling occurred during development, which indicated high adhesion of the used composition.

EXAMPLE 3

The procedures of Example 1 were repeated except that the diazoquinone compound [XXII] was replaced by 11.8 parts by weight of a diazoquinone compound represented by the following structural formula [XXIV].

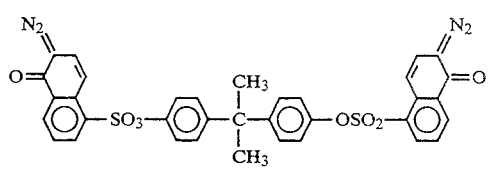

[XXV]

As a result, a good pattern was obtained though the resolution (3.5 μm) was slightly inferior to that in Example 1.

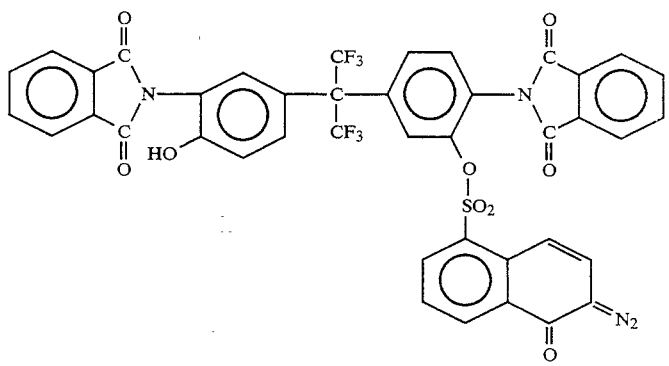

[XXIV]

As a result, a good pattern was obtained though the resolution (5.2 μm) was slightly inferior to that in Example 1. Incidentally, the cured film obtained by heating the used composition to 350° C. had a very high heat decomposition-starting temperature of 404° C.

EXAMPLE 4

The procedures of Example 1 were repeated except that the diazoquinone compound [XXII] was replaced by 6 parts by weight of a diazoquinone compound represented by the following structural formula [XXV].

EXAMPLE 5

The procedures of Example 1 were repeated except that the polyamic acid [XXI] was replaced by 20 parts by weight of a polyamic acid represented by the following structural formula [XXVI].

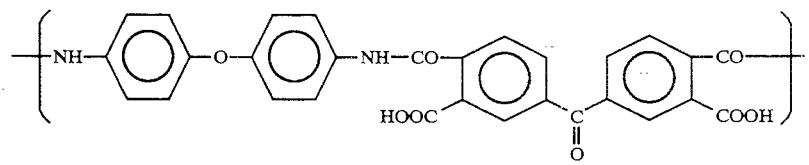

As a result, a good pattern of high resolution (up to 3.5 μm) was obtained, though the fine pattern of about 3.0 μm was peeled and the used composition showed adhesion slightly interior to that in Example 1.

EXAMPLE 6

The procedures of Example 1 were repeated except that the diazoquinone compound [XXII] was replaced by 20 parts by weight of a dihydropyridine compound represented by the structural formula [X]. As a result, a good pattern having a resolution up to 5 μm was obtained though the residual film ratio was 45% and lower than in Example 1. Further, adhesion during development was very good and there was no peeling. The cured film of the used composition gave excellent mechanical properties (tensile strength=12 kg/mm$^2$, tensile elongation=10.8%)

EXAMPLE 7

The procedures of Example 1 were repeated except that the diazoquinone compound [XXII] was replaced by 20 parts by weight of a dihydropyridine compound represented by the structural formula [XI]. As a result, a good pattern having a resolution up to 5 μm was obtained though the residual film ratio was 35% and lower than in Example 6. The cured film of the used composition gave excellent mechanical properties (tensile strength=11.2 kg/mm$^2$, tensile elongation=11.5%).

EXAMPLE 8

The procedures of Example 1 were repeated except that the diazoquinone compound [XXII] was replaced by 5 parts by weight of the diazoquinone compound [XXII] and 20 parts by weight of the dihydropyridine compound [X]. The residual film ratio was 85% and very high as compared with that in Example 6, and a good pattern having a resolution up to 7 μm was obtained. The cured film of the used composition gave excellent mechanical properties (tensile strength=10.5 kg/mm$^2$, tensile elongation= 10.2%).

EXAMPLE 9

A polybenzoxazole precursor (D) represented by the structural formula [XX] was obtained in the same manner as in Example 1.

20.0 g of the polybenzoxazole precursor (D) was dissolved in a solution of 150 ml of tetrahydrofuran and 1.52 g (0.015 mol) of triethylamine. Thereto was dropwise added, at 0°-5° C., 4.03 g (0.015 mol) of naphthoquinonediazidesulfonic acid chloride dissolved in 10 ml of tetrahydrofuran. The resulting mixture was stirred at room temperature for 5 hours. The reaction mixture was filtered to remove the resulting triethylamine hydrochloride, and the filtrate was poured in a water-methanol mixed solution to precipitate a polymer. The precipitated polymer was collected by filtration, washed with a water-methanol solvent thoroughly, and vacuum-dried at 40° C. for 24 hours to obtain a polybenzoxazole precursor to which naphthoquinone diazide portion had been bonded covalently.

1.0 part by weight of the above precursor was dissolved in 5.0 parts by weight of N-methylpyrrolidone. The resulting solution was coated on a silicon wafer using a spinner and dried at 80° C. for 1 hour in a dryer to obtain a film of about 10 μm. On this film was superimposed a mask for measurement of resolution (Toppan Test Chart No. 1 manufactured by TOPPAN PRINTING CO., LTD.). The film was irradiated with ultraviolet rays of 100 mJ/cm$^2$ through the mask, then subjected to development with a 2.38% aqueous tetramethylammonium hydroxide solution, and rinsed with distilled water thoroughly to obtain a pattern of high resolution (up to 5 μm).

The pattern had no crack, and the residual film ratio was 82.0% and was excellent.

EXAMPLE 10

The procedures of Example 1 were repeated except that the polyamic acid [XXI] was replaced by 12 parts by weight of a polybenzothiazole precursor. As a result, a good pattern of high resolution (up to about 5.0 μm) was obtained, though the fine pattern of about 10.0 μm was peeled and showed adhesion inferior to that in Example 1.

EXAMPLE 11

The procedures of Example 1 were repeated except that the polyamic acid [XXI] was replaced by 14 parts by weight of a polybenzoimidazole precursor. As a result, a good pattern of high resolution (up to about 6.2 μm) was obtained, though the fine pattern of 12.4 μm was peeled and showed adhesion inferior to that in Example 1.

EXAMPLE 12

The procedures of Example 1 were repeated except that in the synthesis of polybenzoxazole precursor (D) in Example 1, the equimolar mixture of isophthalic acid chloride and terephthalic acid chloride was replaced by 4,4-diphenyl ether dicarboxylic acid chloride obtained from 27.11 g of 4,4-diphenyl ether dicarboxylic acid and 24.93 g (0,105 mol) of thionyl chloride. As a result, a good pattern having a resolution up to 8 μm was obtained with a residual film ratio of 80%. Incidentally, the cured film of the used composition had excellent mechanical properties (tensile strength=14 kg/mm$^2$, tensile elongation=14%).

EXAMPLE 13

The procedures of Example 1 was repeated except that in the synthesis of polybenzoxazole precursor (D) in Example 1, hexafluoro-2,2-bis(3-amino-4-hydroxyphenyl)propane was replaced by 21.62 g (0,100 mol) of 3,3'-dihydroxybenzidine.

A very high residual film ratio of 95% was obtained, but the cured film of the used composition gave a tensile strength of 4 kg/mm$^2$ and a tensile elongation of 2%, both of which were slightly low.

EXAMPLE 14

The procedures of Example 1 were repeated except that the diazoquinone compound [XXII] was replaced by 12 parts by weight of a diazoquinone compound represented by the following structural formula [XXVII].

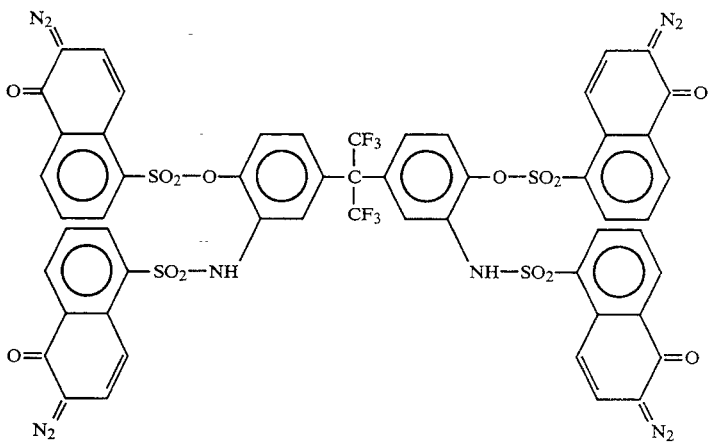
[XXVII]

As a result, a good pattern having a high resolution (up to 3.8 μm) was obtained. No pattern peeling was seen during development, and high adhesion was shown.

EXAMPLE 15

In the evaluation of patterning in Example 1, development was effected using a 1.06% aqueous tetramethylammonium hydroxide solution containing 30 ppm of calcium acetate. The residual film ratio was 92% and very good.

EXAMPLE 16

In the preparation of photo-sensitive resin composition in Example 1, 200 parts by weight of N-methylpyrrolidone as a solvent was replaced by 100 parts by weight of N-methylpyrrolidone and 100 parts by weight of N,N'-dimethylacetamide. The resulting composition gave a good pattern having a resolution up to 3.0 μm.

COMPARATIVE EXAMPLES 1-2

In Example 1, the amount of the polyamic acid [XXI] used was reduced to 0.5 part by weight (Comparative Example 1). As a result, peeling occurred during development and no pattern could be formed. When said amount was increased to 250 parts by weight conversely (Comparative Example 2), both the exposed portions and the unexposed portions were dissolved, with no pattern left.

COMPARATIVE EXAMPLES 3-4

In Example 1, the amount of the diazoquinone compound [XXII] used was reduced to 5 parts by weight (Comparative Example 3). As a result, the sensitivity was low and no clear pattern could be formed. When said amount was increased to 125 parts by weight conversely (Comparative Example 4), the film was fragile and not suitable for practical application.

COMPARATIVE EXAMPLES 5-6

In Example 6, the amount of the dihydropyridine compound of the structural formula [X] used was reduced to 5 parts by weight (Comparative Example 5). As a result, the sensitivity was low and the residual film ratio was low (5%). When said amount was increased to 110 parts by weight conversely (Comparative Example 6), reprecipitation occurred during cold storage of the composition, making the composition unusable.

COMPARATIVE EXAMPLES 7-8

In Example 9, the amount of the naphthoquinonediazidesulfonic acid chloride used was reduced to 0.20 g (Comparative Example 7). The resulting polybenzoxazole precursor to which naphthoquinonediazide portion had been bonded covalently, had low sensitivity and allowed no patterning. When said amount was increased to 16.09 g conversely (Comparative Example 8), the resulting polybenzoxazole precursor to which naphthoquinonediazide portion had been bonded covalently, had no solubility in the developer at the exposed portions and allowed no patterning.

As clear from the above Examples and Comparative Examples, the present invention provides a photo-sensitive resin composition having high adhesion to substrates (e.g., silicon oxide film) as well as excellent resolution, heat resistance, flexibility, electrical properties and mechanical properties.

We claim:

1. A positive photo-sensitive resin composition comprising in admixture, 100 parts by weight of a photo-sensitive group-containing polybenzoxazole precursor having a polymerization degree of 2–500, obtained by polymerizing monomers (A), (S) and (C) having groups represented by the following formulas [I], [XV] and [III], respectively,

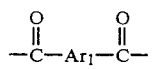
[I]

wherein $Ar_1$ is a divalent aromatic or heterocyclic group,

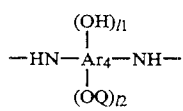
[XV]

wherein $Ar_4$ is a tetravalent aromatic or heterocyclic group, $l_1$ is an integer of 0–2, $l_2$ is an integer of 1–2, the sum of $l_1$ and $l_2$ is 2, and Q is

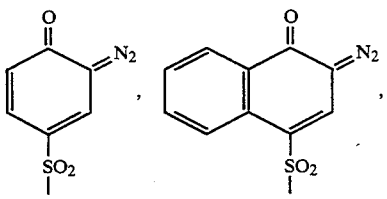

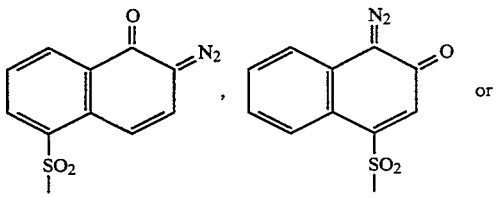

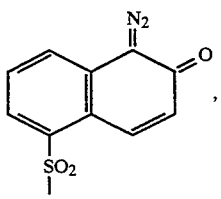

wherein Ar₃ is a divalent aromatic, heterocyclic, alicyclic, silicon-containing or aliphatic group, in such proportions as to satisfy the following formula, (A)/[(S)+(C)]=0.9–1.1 wherein (S) is 2–100 mole % and (C) is 0–98 mole % with the total of (S) and (C) being 100 mole %, and 1–200 parts by weight of at least one organic solvent-soluble polymer having an aromatic group and/or a heterocyclic group or its precursor (E), the polymer being selected from polyimide, polybenzoimidazole, poly-benzothiazole, polytriazole, polyoxadiazole, polythiadiazole, polybenzoxazinone, polyquinazolinedione, polyimidoisoindoloquinazolinedion, polyquinazolone, polyquinacridone, polyanthrazoline, polyindophenazine and polyhydantoin.

2. A positive photo-sensitive resin composition comprising in admixture:
(i) 100 parts by weight of a polybenzoxazole precursor (D) having a polymerization degree of 2–500, obtained by polymerizing monomers (A), (B) and (C) having groups represented by the following formulas [I], [II] and [III], respectively,

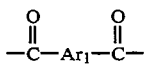 [I]

wherein Ar₁ is a divalent aromatic or heterocyclic group,

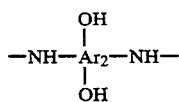 [II]

wherein Ar₂ is a tetravalent aromatic or heterocyclic group,

—NH—Ar₃—NH— [III]

wherein Ar₃ is a divalent aromatic, heterocyclic, alicyclic, silicon-containing or aliphatic group, in such proportions as to satisfy the following formula, (A)/[(B)+(C)]=0.9–1.1 wherein (B) is 2–100 mole % and (C) is 0–98 mole % with the total of (B) and (C) being 100 mole %,
(ii) 1–200 parts by weight of at least one organic solvent-soluble polymer having an aromatic group and/or a heterocyclic group or its precursor (E), the polymer being selected from polyimide, polybenzoimidazole, polybenzothiazole, polytriazole, polyoxadiazole, polythiadiazole, polybenzoxazinone, polyquinazolinedione, polyimidoisoindoloquinazolinedione, polyquinazolone, polyquinacridone, polyanthrazoline, polyindophenazine and polyhydantoin, and
(iii) 10–100 parts by weight of a photo-sensitive agent (H) consisting of a diazoquinone compound (F) and/or a dihydropyridine compound (G).

3. A positive photo-sensitive resin composition according to claim 2, wherein the polybenzoxazole precursor (D) is a condensate obtained from a dicarboxylic acid or its chloride or ester and an aromatic dihydroxydiamine compound and/or a heterocyclic dihydroxydiamine compound.

4. A positive photo-sensitive resin composition according to claim 3, wherein the dicarboxylic acid is at least one dicarboxylic acid selected from the group consisting of terephthalic acid, isophthalic acid and 4,4'-diphenyl ether dicarboxylic acid.

5. A positive photo-sensitive resin composition according to claim 3, wherein the dihydroxydiamine compound is at least one dihydroxydiamine compound selected from the group consisting of hexafluoro-2,2-bis(3-amino-4-hydroxyphenyl)propane, 3,3'-dihydroxybenzidine and 3,3'-dihydroxy-4,4'-diaminodiphenyl ether.

6. A positive photo-sensitive resin composition according to claim 1, wherein the organic solvent-soluble polymer having an aromatic group and/or a heterocyclic group or its precursor (E) has bonded thereto a polysiloxane unit represented by the following formula [IV]:

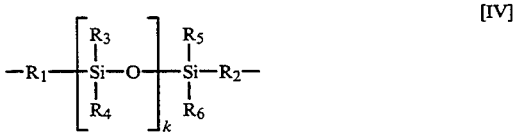 [IV]

wherein R₁ to R₂ are each a divalent aliphatic or aromatic group; R₃ to R₆ are each a monovalent aliphatic or aromatic group; and k is an integer of 1–100.

7. A positive photo-sensitive resin composition according to claim 2, wherein the organic solvent-soluble polymer or its precursor (E) is a polyamic acid.

8. A positive photo-sensitive resin composition according to claim 7, wherein the polyamic acid is a polyamic acid represented by the following formula [V]:

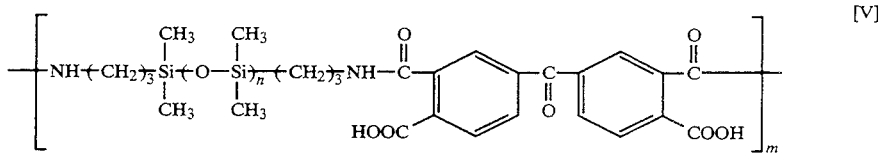

wherein n is an integer of 1–50 and m is an integer of 2–500.

9. A positive photo-sensitive resin composition according to claim 2, wherein the diazoquinone compound (F) is represented by any one of the following formulas [VI] to [IX]:

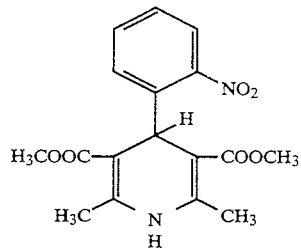

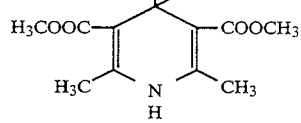

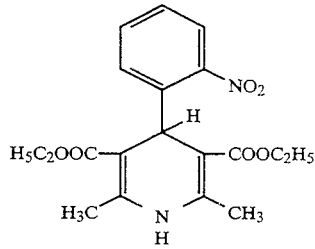

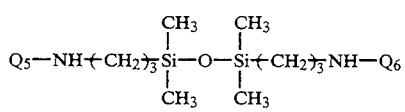

wherein $Q_1$ to $Q_6$ are each hydrogen atom or 1,2-naphthoquinonediazide-5-sulfonyl group, and at least one of $Q_1$ to $Q_4$ and at least one of $Q_5$ to $Q_6$ are each 1,2-naphthoquinonediazide-5-sulfonyl group.

10. A positive photo-sensitive resin composition according to claim 2, wherein the polybenzoxazole precursor (D) is obtained from (a) dicarboxylic acids consisting of terephthalic acid or terephthalic acid chloride and isophthalic acid or isophthalic acid chloride and (b) hexafluoro-2,2-bis(3-amino-4-hydroxyphenyl)propane, the organic solvent-soluble polymer precursor (E) is a polyamic acid represented by the formula [V], and the diazoquinone compound (F) is represented by the formula [VI].

11. A positive photo-sensitive resin composition according to claim 2, wherein the dihydropyridine compound (G) is represented by any one of the following formulas [X] to [XIV].

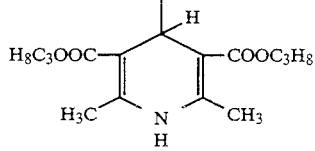

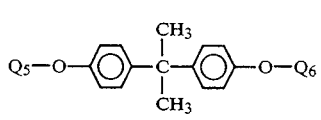

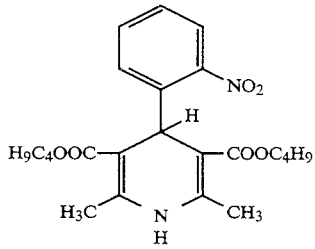

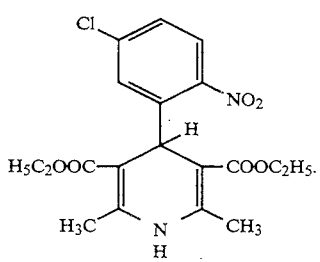

* * * * *